(12) United States Patent
Weber

(10) Patent No.: US 9,723,738 B2
(45) Date of Patent: Aug. 1, 2017

(54) ENCLOSURE FOR ELECTRICAL INSTALLATIONS

(71) Applicant: Fibox Oy Ab, Espoo (FI)

(72) Inventor: Kenneth Weber, Karjaa (FI)

(73) Assignee: FIBOX OY AB, Espoo (FI)

( * ) Notice: Subject to any disclaimer, the term of this patent is extended or adjusted under 35 U.S.C. 154(b) by 0 days.

(21) Appl. No.: 14/901,589

(22) PCT Filed: Jun. 27, 2014

(86) PCT No.: PCT/FI2014/050533
§ 371 (c)(1),
(2) Date: Dec. 28, 2015

(87) PCT Pub. No.: WO2014/207318
PCT Pub. Date: Dec. 31, 2014

(65) Prior Publication Data
US 2016/0135315 A1    May 12, 2016

(30) Foreign Application Priority Data

Jun. 27, 2013 (FI) ...................................... 20135702

(51) Int. Cl.
*H05K 5/03* (2006.01)
*H02B 1/38* (2006.01)
*H05K 5/02* (2006.01)

(52) U.S. Cl.
CPC ................ *H05K 5/03* (2013.01); *H02B 1/38* (2013.01); *H05K 5/0221* (2013.01); *H05K 5/0226* (2013.01)

(58) Field of Classification Search
CPC combination set(s) only.
See application file for complete search history.

(56) References Cited

U.S. PATENT DOCUMENTS

| 4,863,062 A | 9/1989 | Holliday |
| 5,561,886 A | 10/1996 | Flamme |

(Continued)

FOREIGN PATENT DOCUMENTS

| EP | 0593106 A1 | 4/1994 |
| EP | 1398439 A2 | 3/2004 |
| FR | 2690792 A1 | 11/1993 |

*Primary Examiner* — Dhirubhai R Patel
(74) *Attorney, Agent, or Firm* — Birch, Stewart, Kolasch & Birch, LLP

(57) ABSTRACT

An enclosure for electrical installations includes a bottom part and a cover hinged to the bottom part, the bottom part including a first top edge with a first fastener including a first recess and a first platform for receiving a hinge of the enclosure in a form-locked manner, and a second top edge with a second fastener including a second recess and a second platform that permits the receipt of the hinge of the enclosure in a form-locked manner, and the first fastener and second fastener are arranged on respective top edges of the enclosure to be diametrically opposite each other. In order to hinge the cover on the desired top edge of the bottom part of the enclosure and to provide the locking of the cover to the bottom part with a turnable latch, the first platform forms a first cavity on a first inner wall of the bottom part of the enclosure for receiving the latch, and the second platform forms a second cavity on a second inner wall of the bottom part of the enclosure for receiving the latch.

20 Claims, 2 Drawing Sheets

(56) References Cited

U.S. PATENT DOCUMENTS

| | | | |
|---|---|---|---|
| 6,065,612 A | 5/2000 | Rinderer | |
| 6,184,461 B1* | 2/2001 | Flegel | H01R 13/72 174/135 |
| 7,845,990 B2* | 12/2010 | Shrum | H01R 13/5216 174/66 |
| 8,584,895 B1* | 11/2013 | Cleghorn | H01H 9/02 174/50 |
| 2004/0000028 A1 | 1/2004 | Kim | |

* cited by examiner

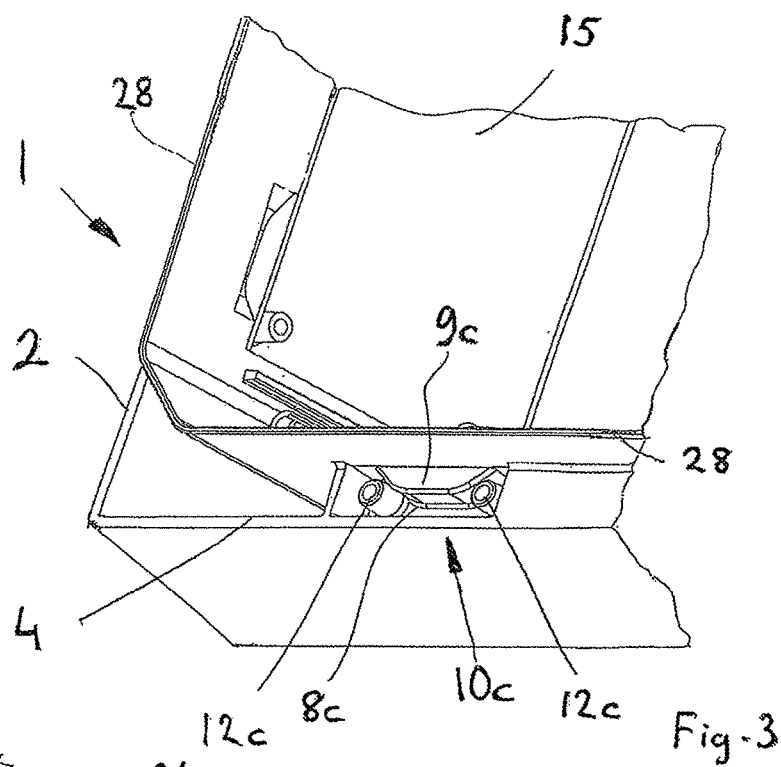
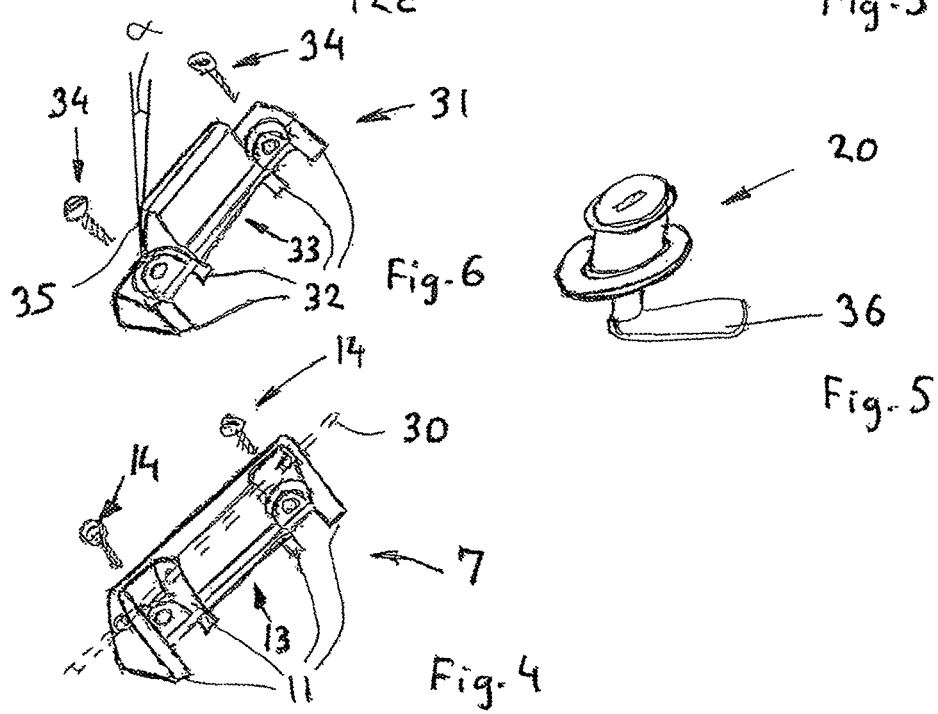

ENCLOSURE FOR ELECTRICAL INSTALLATIONS

BACKGROUND OF THE INVENTION

The invention relates to an enclosure for electrical installations, the enclosure comprising a rectangular bottom part and a cover to be placed on the bottom part and hinged to the bottom part by means of a hinge means, the bottom part comprising a bottom and side walls extending upward from the bottom and opposite first and second top edges associated with the side walls as well as opposite third and fourth top edges.

The application of electrical enclosures sometimes requires that they comprise left-handed or right-handed hinging depending on which way the cover (door) is to open. In addition, the cover also often needs to be lockable. So as to meet said requirements, the opposite side walls of the bottom part in known enclosures differ from each other in detail. Therefore, at least two bottom parts differing in detail are manufactured for one enclosure type and size. Manufacturing two or more different bottom parts incurs high tooling costs, because at least two plastic moulds are required for manufacturing the bottom parts. In addition, the need for two or more different bottom parts causes logistical problems in storing the enclosures.

BRIEF DESCRIPTION OF THE INVENTION

It is an object of the invention to provide an enclosure, in which the bottom part permits the installation of the cover to the bottom part in such a manner that it opens to the desired direction, left or right, and also provides a new solution for locking the cover to the bottom part with a locking means that comprises a turnable latch.

The object of the invention is achieved by an enclosure comprising
  a rectangular bottom part,
  a cover to be placed on the bottom part and hinged to the bottom part by means of a hinge means,
  the bottom part comprising a bottom and side walls extending upward from the bottom and opposite first and second top edges associated with the side walls as well as opposite third and fourth top edges with the first top edge,
  the first top edge having at least one first fastener comprising a first recess and a platform abutting the first recess for receiving the hinge means of the enclosure in a form-locked manner such that a protruding part of the hinge means settles into said first recess and a recess of the hinge means settles against the first platform, and the first fastener also comprises a first fastening means for receiving a fastening element of the hinge means for the purpose of detachably fastening the hinge means to the first fastener,
  the second top edge having at least one second fastener comprising a second recess and a platform abutting the second recess, which is formed to permit the receipt of the hinge means in a form-locked manner such that the protruding part of the hinge means settles into the second recess and the recess of the hinge means settles against a second platform, and the second fastener also comprises a second fastening means that is formed to permit the receipt of the fastening element of the hinge means for removably fastening the hinge means to the second fastener,
  the first fastener and the second fastener being arranged on respective top edges of the enclosure diametrically opposite each other in such a manner that an imaginary direct line passing through a centre point of the bottom of the bottom part of the enclosure and perpendicular to a plane defined by the bottom of the bottom part of the enclosure intersects an imaginary direct line that extends from the first fastener to the second fastener,
  the first platform forming a first cavity in a first inner wall of the bottom part (1) of the enclosure to open toward an interior of the bottom part,
  the second platform forming a second cavity in a second inner wall of the bottom part of the enclosure to open toward the interior of the bottom part (1), and
  the cover of the enclosure comprising at least one locking means for locking the cover to the bottom part of the enclosure, the locking means comprising a turnable latch arranged optionally to move to a first position, where it is in the first cavity or in the second cavity, for locking the cover to the bottom part of the enclosure, or to a second position, where it is outside said first cavity or said second cavity in the interior of the bottom part of the enclosure.

An essential idea of the invention is to form on two opposite top edges of the enclosure similar fasteners which are diametrically opposite each other and in which it is possible to detachably attach a hinge means through form locking for the purpose of hinging the cover to the bottom part of the enclosure on a desired side wall, whereby a platform belonging to the form-lock implementation forms a cavity on opposite inner walls of the bottom part of the enclosure for receiving a locking tongue of the locking means of the cover. When the locking tongue is in said cavity, the cover is locked to the bottom part. The fastener may be referred to as a multifunctional fastener.

All top edges of the bottom part preferably have fasteners of said type, whereby the hinging of the cover to the bottom part can be implemented on any side wall of the bottom part and, correspondingly, the locking of the cover can be implemented on any side wall—even on the side wall of the hinge side, if the enclosure is intended for use in demanding conditions.

Preferred embodiments of the invention are disclosed in dependent claims.

Significant advantages of the enclosure according to the invention include that the bottom part permits alternatively a left-handed or right-handed hinging of the cover and also the receiving of the locking tongue of the locking means on the cover. Thanks to the fact that the fastener platform also forms a cavity opening into the interior of the enclosure, the manufacturing of the fastener in a plastic mould is not a problem, because the platform does not form in the bottom part a thick part that would cool slower in the plastic mould than other parts of the bottom part of the enclosure. It is known that uneven cooling causes residual stress, distortion and risk of cracking in the manufacture of a plastic product. The fasteners of the bottom part can be injection-moulded as one piece with the bottom part. The fastener on the bottom part of the enclosure according to the invention also permits the fastening of a guiding piece to it to facilitate the settling of the cover in the correct position on top of the bottom part. This is significant in large enclosures, in particular, the cover of which are susceptible to bending (flexing), which results in the cover not settling in the correct position against the top edge of the bottom part. The correct settling of the cover is important in a situation, where the cover is to seal against a sealing between the bottom part and cover, for instance.

BRIEF DESCRIPTION OF THE DRAWINGS

The invention will now be described in more detail by means of a preferred embodiment thereof and with reference to the accompanying drawing, in which FIG. 3 shows the left bottom corner of the bottom part of FIG. 2 as seen obliquely from above, FIG. 4 shows a hinge means of the enclosure, FIG. 5 shows a locking means on the cover of the enclosure, and FIG. 6 shows a guiding means for use in the enclosure of the invention.

DETAILED DESCRIPTION OF THE INVENTION

Figure 1:
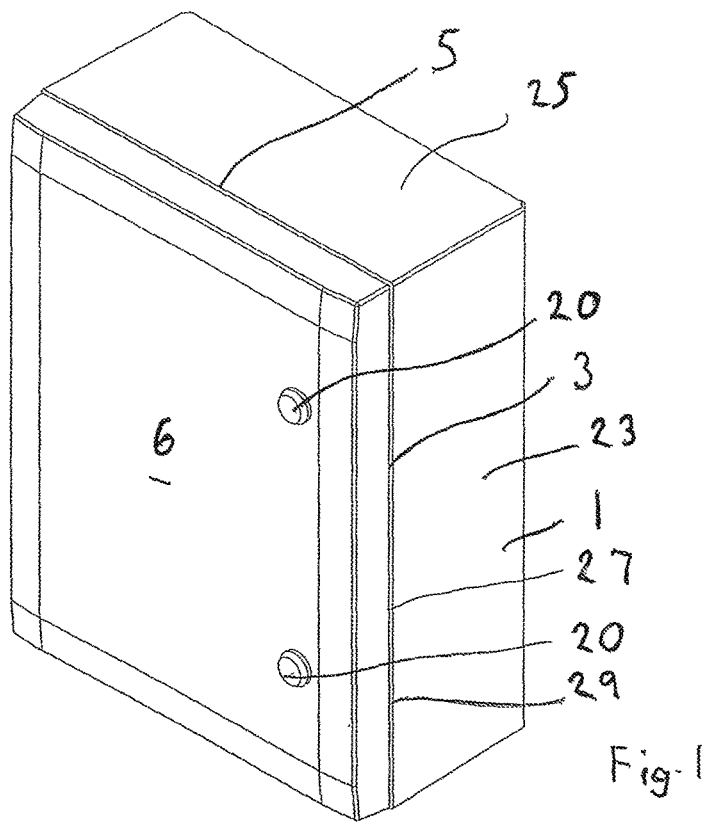
FIG. 1 shows a general view of an enclosure according to the invention.

The enclosure for electrical installations shown in FIG. 1 comprises a bottom part 1 and a cover 6 that settles on top of the bottom part. The cover 6 is hinged by means of two hinge means (not shown in FIG. 2, but shown and designated with reference number 7 in FIG. 4) to a fastener (fasteners 10a in FIG. 2) on the top edge (top edge 2 in FIG. 2) of the left side wall (side wall 22 in FIG. 2) of the bottom part 1 of the enclosure. The cover 6 comprises locking means 20 that permit the locking of the cover to two fasteners 10b on the top edge 3 of the right side wall (side wall 23 in FIG. 2) of the bottom part 1 of the enclosure.

Figure 2:
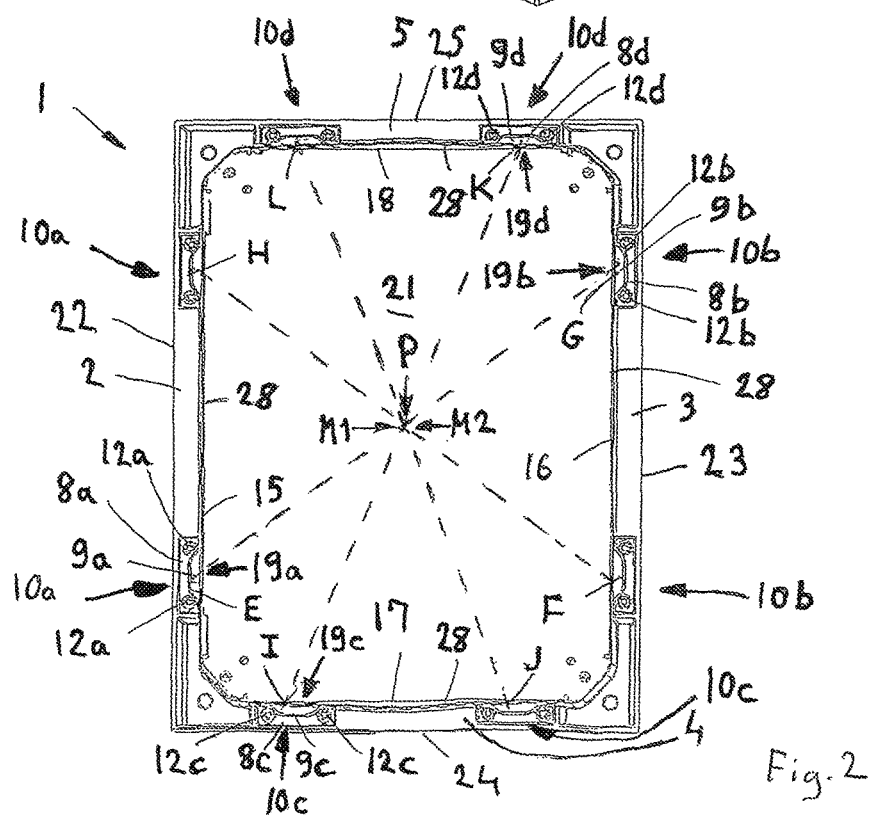
FIG. 2 shows the bottom part of the enclosure of FIG. 1 as seen directly from above.

As can be seen in FIG. 2, the fasteners 10a and 10b are similar in structure and placed on the top edges 2 and 3 of the bottom part 1 diametrically opposite each other in such a manner that an imaginary direct line passing through a centre point P of the enclosure bottom 21, which is perpendicular to the plane defined by the enclosure bottom 21, intersects an imaginary direct line (shown as a dashed line) that extends from the fastener 10a to the diametrically opposite fastener 10b. Correspondingly, the top edges 4 and 5 of the side walls 24 and 25 of the bottom part 1 of the enclosure 1 have similar fasteners 10c and 10d. The fasteners 10a, 10b, 10c, and 10d may be referred to as first, second, third, and fourth fasteners. Each fastener 10a to 10d has a recess (recesses 8a to 8d) and a platform (platforms 9a to 9d). The platform is an elevated part of the fastener. The recesses 8a to 8d settle against the platform 9a to 9d. The recesses 8a, 8b, 8c, and 8d may be referred to as first, second, third, and fourth recesses. The platforms 9a, 9b, 9c, and 9d may be referred to as first, second, third, and fourth platforms. The hinge means 7 comprise a protruding part 11 that settles into the recess 8a in the fastener 10a, and a recess 13 that settles against the platform 9a on the fastener 10a. The hinge means 7 actually has several protruding parts 11, but they can be understood to form together a protruding part. Said recesses 8a, 13 and platforms 9a and protruding parts 11 form a type of form-lock, when the hinge means 7 is placed in the fastener 10a. In addition, the fastener 10a comprises two fastening means (fastening means 12a), into which fastening elements 14 of the hinge means 7 (see FIG. 4) can be fastened for the purpose of fastening the hinge means detachably to the fastener 10a. The fastening means 12a are bores and the fastening elements 14 are preferably screws. Because the fasteners 10a to 10d are similar in structure, the hinge means 7 can alternatively be fastened with the fastening elements 14 to the fastening means 12a to 12d of any fastener 10a to 10d. The fastening means 12a, 12b, 12c, and 12d may be referred to as first, second, third, and fourth fastening means. In FIG. 4, the hinge axis 30 of the hinge means 7 is illustrated by a dashed line.

The arrangement described above makes it possible to fasten the cover 6 to the fastener 10a to 10d of any top edge 2 to 5 of the side wall 22 to 25 on the bottom part 1, whereby the cover 6 can made to open into any direction: left, right, downward, or upward.

In FIG. 3, reference number 19a indicates a cavity formed by the platform 9a of the fastener 10a of FIG. 2 that opens toward the interior of the bottom part 1 of the enclosure. A corresponding arrangement applies to the fasteners 10b to 10d, that is, the platforms 9b to 9d of the fasteners 10b to 10d form cavities 19b to 19d on the inner walls 16 to 18 of the bottom part 1 of the enclosure. The cavities 19a, 19b, 19c, and 19d may be referred to as first, second, third, and fourth cavities. The latch (that in FIG. 5 is marked by reference number 36) of the locking means 20 on the cover 6 can be turned in such a manner that it enters the cavity 19b formed on the inner wall 16 of the bottom part 1 by the platform part 9b of the fastener 10b. When the latch 21 is in the cavity 19b, the cover 6 is locked to the bottom part 1. If the intention is to provide an enclosure, in which the cover 6 opens to the right, that is, in the opposite direction to that of FIG. 1, the hinge means 7 are fastened to fasteners 10b and the cover 6 is turned in a position, where its locking means 20 settle close to the side wall 22, whereby the latches 36 of the locking means on the cover can enter the cavity 19a on the inner wall 15 of the side wall 22.

In the enclosure of FIGS. 1 and 2, a centre point M1 of an imaginary rectangle E-F-G-H formed by the fasteners 10a and 10b is on an imaginary direct line that is perpendicular to the bottom 21 of the bottom part 1 of the enclosure and passes through the centre point P of the bottom 21 of the bottom part. In addition, in the enclosure of FIGS. 1 and 2, a centre point M2 of an imaginary rectangle I-J-K-L formed by the fasteners 10c and 10d is on an imaginary direct line that is perpendicular to the bottom 21 of the bottom part 1 of the enclosure and passes through the centre point P of the bottom 21 of the bottom part. Thus, points M1 and M2 are at the same location.

FIG. 6 shows a guide piece 31 that, similar to the hinge means 7, comprises a protruding part 32 and recess 33. Thus, the guide piece 31 can be set in a form-locked manner to a fastener, such as fastener 10d, on the top edge 5 of the enclosure bottom part 1 and fastened thereto with fastening elements 34 that are preferably screws. The guide piece 31 comprises a guide surface 35 that guides the bottom edge 27 of the cover 6 against the top edge of the bottom part 1 so that the bottom edge 27 of the cover settles in exactly the correct position against the top edge of the bottom part. By using two or more guide pieces 31, the bottom edge of the cover 6 can be set in exactly the correct position against the top edges 2 to 5 of the bottom part. Thanks to the guide pieces 31 arranged on the top edges 4, 5 of the bottom part 1, a sealing (not shown for the sake of simplicity) on the cover 6 can be fitted exactly against a ridge 28 associated with the top edges 2 to 5 of the bottom part, even if the sealing was narrow. It is as though the guide piece 31 lifts the cover 6 (door) and guides the sealing of the cover to make the ridge of the bottom part 1 settle in the middle of the sealing. Instead of the bottom edge 27 of the cover, the sealing may alternatively be arranged on the top edges 2 to 5 of the bottom part 1. The guide surface 35 of the guide piece 31 is wedge-shaped in such a manner that it is at a small angle α, 10 to 20 degrees, for instance, to the vertical axis. The guide surface 35 may be slightly curved. If the cover 6 is hinged to the top edge 3 of the side wall 23, the guide piece 31 may be fastened to any fastener 10a, 10c, and 10d. When the cover 6 is on top of the bottom part 1 in such a manner that the ridge 28 is against the sealing, there is a small gap 29 between the bottom edge 27 of the cover and the top edges 2 to 5 of the bottom part, even though the cover was locked to the bottom part. The size of the gap 29 is 2 to 5 mm, for instance. The gap 29 makes it possible to connect two adjacent bottom parts to each other with a connecting piece (not shown), even if their bottom parts were covered by covers. The connecting piece comprises two fastener parts that can be form-locked like the above-mentioned hinge means 7 and guide piece 31—to the fasteners of adjacent bottom parts. The fastener parts of the connecting piece are connected by a bridge part (not shown) that settles in said gap 29. Thus, the gap 29 provides space for the bridge part of the connecting piece, the thickness of which is at most the size of the gap 29. The fasteners 10a to 10d, gap 29, and connecting piece make it possible to build enclosure entities of different sizes.

In the above, the invention is described by means of one example only, wherefore it is noted that the details of the invention may be implemented in many ways within the scope of the attached claims. Accordingly, the detailed design of the fasteners on the top edges of the bottom part of the enclosure and the design of the protruding parts of the hinge means and that of the recess may vary from what is shown in the figures. The number of fasteners on the top edges of the bottom part of the enclosure may vary: two opposite top edges have altogether at least two fasteners, preferably four, as shown in FIG. 2. Four fasteners provide a strong fastening. Naturally, the top edge may even have three or more fasteners, but too many fasteners makes the structure overly complex in view of manufacturing and installation. The top edge of each side wall of the bottom part of the enclosure need not have fasteners, but it is recommended, because it permits the hinging of the cover on any edge.

The invention claimed is:

1. An enclosure for electrical installations, the enclosure comprising:
    a rectangular bottom part;
    a cover to be placed on the bottom part and hinged to the bottom part by a plurality of hinges, wherein each hinge comprises a fastening element for detachably fastening the hinge to the bottom part;
    the bottom part comprising a bottom and side walls extending upward from the bottom and opposite first and second top edges as well as opposite third and fourth top edges associated with the side walls;
    the first top edge having at least one first fastener of a plurality of fasteners comprising a first recess and a platform abutting the first recess for receiving a first hinge of said plurality of hinges of the enclosure in a form-locked manner such that a protruding part of the first hinge settles into said first recess and a recess of the first hinge settles against the first platform, and the first fastener also comprises a first bore for receiving the fastening element of the first hinge for the purpose of detachably fastening the first hinge to the first fastener,
    the second top edge having at least one second fastener of the plurality of fasteners comprising a second recess and a platform abutting the second recess, which is formed to permit the receipt of a second hinge of said plurality of hinges in a form-locked manner such that the protruding part of the second hinge settles into the second recess and the recess of the second hinge settles against a second platform, and the second fastener also comprises a second bore that is formed to permit the receipt of the fastening element of the second hinge for removably fastening the second hinge to the second fastener,
    the first fastener and the second fastener being arranged on respective top edges of the enclosure diametrically opposite each other in such a manner that an imaginary direct line passing through a center point of the bottom of the bottom part of the enclosure and perpendicular to a plane defined by the bottom of the bottom part of the enclosure intersects an imaginary direct line that extends from the first fastener to the second fastener, wherein
    the first platform forming a first cavity in a first inner wall of the bottom part of the enclosure to open toward an interior of the bottom part,
    the second platform forming a second cavity in a second inner wall of the bottom part of the enclosure to open toward the interior of the bottom part, and
    the cover of the enclosure comprising at least one lock for locking the cover to the bottom part of the enclosure, the lock comprising a turnable latch arranged optionally to move to a first position, where it is in the first cavity or in the second cavity, for locking the cover to the bottom part of the enclosure, or to a second position, where it is outside said first cavity or said second cavity in the interior of the bottom part of the enclosure.

2. The enclosure as claimed in claim 1, wherein the first top edge of the bottom part of the enclosure has two fasteners of the plurality of fasteners and the second top edge of the bottom part of the enclosure has two fasteners of the plurality of fasteners arranged diametrically opposite each other in such a manner that a center point of an imaginary rectangle formed by them is on an imaginary direct line that is perpendicular to the bottom of the bottom part of the enclosure and passes through the center point of the bottom of the bottom part.

3. The enclosure as claimed in claim 2, wherein the third top edge of the bottom part has at least one third fastener of the plurality of fasteners comprising a third recess and a third platform abutting the third recess, which is formed to permit the receipt of a third hinge of said plurality of hinges in a form-locked manner such that the protruding part of the third hinge settles into said third recess and the recess of the third hinge settles against the third platform, and the third fastener also comprises a third bore for receiving the fastening element of the third hinge for the purpose of detachably fastening the third hinge to the third fastener, and the third platform forms a third cavity in a third inner wall of the bottom part of the enclosure to open toward the interior of the bottom part, and the fourth top edge of the bottom part has at least one fourth fastener of the plurality of fasteners comprising a fourth recess and a fourth platform abutting the fourth recess, which is formed to permit the receipt of a fourth hinge of said plurality of hinges in a form-locked manner such that the protruding part of the third hinge settles into the fourth recess and the recess of the third hinge settles against the fourth platform, and the fourth fastener also comprises a fourth bore that is formed to permit the receipt of the fastening element of the fourth hinge for the purpose of detachably fastening the fourth hinge to the fourth fastener, and that the fourth platform forms on a fourth inner wall of the bottom part a fourth cavity that opens toward the interior of the bottom part, and the third fastener and fourth fastener are arranged on respective top edges of the enclosure diametrically opposite each other in such a manner that an imaginary direct line passing through the center point of the bottom of the bottom part of the enclosure and perpendicular to a plane defined by the bottom of the bottom part of the enclosure intersects an imaginary direct line that extends from the third fastener to the fourth fastener.

4. The enclosure as claimed in claim 2, wherein the fasteners are formed as one piece with the bottom part of the enclosure.

5. The enclosure as claimed in claim 2, wherein at least some of the fasteners are arranged to be detachably received in a form-locked manner, instead of the hinges, by a guide piece for guiding the cover against the bottom part, the guide piece comprising a protruding part to be set in said recess of the fastener and a recess to be set against said platform of the fastener.

6. The enclosure as claimed in claim 2, wherein all of its fasteners are identical with each other.

7. The enclosure as claimed in claim 1, wherein the third top edge of the bottom part has at least one third fastener of the plurality of fasteners comprising a third recess and a third platform abutting the third recess, which is formed to permit the receipt of a third hinge of said plurality of hinges in a form-locked manner such that the protruding part of the third hinge settles into said third recess and the recess of the third hinge settles against the third platform, and the third fastener also comprises a third bore for receiving the fastening element of the third hinge for the purpose of detachably fastening the third hinge to the third fastener, and the third platform forms a third cavity in a third inner wall of the bottom part of the enclosure to open toward the interior of the bottom part, and the fourth top edge of the bottom part has at least one fourth fastener of the plurality of fasteners comprising a fourth recess and a fourth platform abutting the fourth recess, which is formed to permit the receipt of a fourth hinge of said plurality of hinges in a form-locked manner such that the protruding part of the fourth hinge settles into the fourth recess and the recess of the fourth hinge settles against the fourth platform, and the fourth fastener also comprises a fourth bore that is formed to permit the receipt of the fastening element of the fourth hinge for the purpose of detachably fastening the fourth hinge to the fourth fastener, and that the fourth platform forms on a fourth inner wall of the bottom part a fourth cavity that opens toward the interior of the bottom part, and the third fastener and fourth fastener are arranged on respective top edges of the enclosure diametrically opposite each other in such a manner that an imaginary direct line passing through the center point of the bottom of the bottom part of the enclosure and perpendicular to a plane defined by the bottom of the bottom part of the enclosure intersects an imaginary direct line that extends from the third fastener to the fourth fastener.

8. The enclosure as claimed in claim 7, wherein the third top edge of the bottom part of the enclosure has two fasteners of the plurality of fasteners and the fourth top edge of the bottom part of the enclosure has two fasteners of the plurality of fasteners arranged diametrically opposite each other in such a manner that a center point of an imaginary rectangle formed by them is on an imaginary direct line that is perpendicular to the bottom of the bottom part of the enclosure and passes through the center point of the bottom of the bottom part.

9. The enclosure as claimed in claim 8, wherein the fasteners are formed as one piece with the bottom part of the enclosure.

10. The enclosure as claimed in claim 8, wherein at least some of the fasteners are arranged to be detachably received in a form-locked manner, instead of the hinges, by a guide piece for guiding the cover against the bottom part, the guide piece comprising a protruding part to be set in said recess of the fastener and a recess to be set against said platform of the fastener.

11. The enclosure as claimed in claim 8, wherein all of its fasteners are identical with each other.

12. The enclosure as claimed in claim 7, wherein the fasteners are formed as one piece with the bottom part of the enclosure.

13. The enclosure as claimed in claim 7, wherein all of its fasteners are identical with each other.

14. The enclosure as claimed in claim 7, wherein at least some of the fasteners are arranged to be detachably received in a form-locked manner, instead of the hinges, by a guide piece for guiding the cover against the bottom part, the guide piece comprising a protruding part to be set in said recess of the fastener and a recess to be set against said platform of the fastener.

15. The enclosure as claimed in claim 1, wherein the fasteners are formed as one piece with the bottom part of the enclosure.

16. The enclosure as claimed in claim 15, wherein at least some of the fasteners are arranged to be detachably received in a form-locked manner, instead of the hinges, by a guide piece for guiding the cover against the bottom part, the guide piece comprising a protruding part to be set in said recess of the fastener and a recess to be set against said platform of the fastener.

17. The enclosure as claimed in claim 1, wherein at least some of the fasteners are arranged to be detachably received in a form-locked manner, instead of the hinges, by a guide piece for guiding the cover against the bottom part, the guide piece comprising a protruding part to be set in said recess of the fastener and a recess to be set against said platform of the fastener.

18. The enclosure as claimed in claim 1, wherein all of its fasteners are identical with each other.

19. The enclosure as claimed in claim 1, wherein the fastening element of the hinges is a screw.

20. The enclosure as claimed in claim 19, wherein each fastener has two bores arranged in the recess of the fastener.

* * * * *